United States Patent [19]
Abbiati et al.

[11] Patent Number: 5,598,127
[45] Date of Patent: Jan. 28, 1997

[54] PROCEDURE AND CIRCUIT FOR ADAPTIVE COMPENSATION OF THE GAIN DISTORTIONS OF A MICROWAVE AMPLIFIER WITH LINEARIZER

[75] Inventors: Antonio Abbiati, S. Angelo Lodigiano; Carlo Buoli, Mirandola; Luigi Cervi, Olmeneta, all of Italy

[73] Assignee: Italtel S.p.A., Milan, Italy

[21] Appl. No.: 454,369

[22] PCT Filed: Dec. 6, 1993

[86] PCT No.: PCT/EP93/03432
§ 371 Date: Jun. 6, 1995
§ 102(e) Date: Jun. 6, 1995

[87] PCT Pub. No.: WO94/15395
PCT Pub. Date: Jul. 7, 1994

[30] Foreign Application Priority Data

Dec. 23, 1992 [IT] Italy .................................. MI92A2936

[51] Int. Cl.⁶ ....................................................... H03C 1/32
[52] U.S. Cl. ............................. 330/149; 375/297; 455/63; 455/126
[58] Field of Search ............................. 330/149; 332/159, 332/160, 162; 375/297; 455/63, 126

[56] References Cited

U.S. PATENT DOCUMENTS 5,302,914  4/1994  Arntz et al. ......................... 330/124 R Primary Examiner—James B. Mullins
Attorney, Agent, or Firm—Herbert L. Lerner; Laurence A. Greenberg

[57] ABSTRACT

There are described a procedure and circuit for adaptive compensation of the gain distortions caused by thermal drift, ageing, etc., in microwave amplifiers connected to predistortion linearizers. The procedure concerns digitally modulated signals, e.g., QAM, in which the peak to average power signal ratio is constant. Since this ratio remains constant after amplification only if the amplifier is linear, it is measured at the amplifier output, to change the AM/FM distortion characteristic of the linearizer/amplifier chain and hold the ratio on the output equal to that on the input.

5 Claims, 2 Drawing Sheets

PROCEDURE AND CIRCUIT FOR ADAPTIVE COMPENSATION OF THE GAIN DISTORTIONS OF A MICROWAVE AMPLIFIER WITH LINEARIZER

BACKGROUND OF THE INVENTION

FIELD OF THE INVENTION

The present invention relates to the field of radio frequency signal transmission and more specifically concerns a procedure and a circuit for adaptive compensation of the gain distortions of a microwave amplifier with linearizer.

As known, a power amplifier behaves linearly, i.e. has gain and phase characteristics which are constant with input signal power variation and generally only for a certain range of values of said power. In a generic amplifier, the deviations from linearity consist principally of a gain compression and an increase in the input/output phase shift for high input signal power levels. Said nonlinearities produce amplified signal distortion and hence an increase in intermodulation noise. Transmission of such a signal can cause serious inconvenience for the receivers, as for example a high value of BER in case of digitally modulated signals. To obviate this inconvenience there have been in use for some time appropriate linearized circuits made in accordance with different circuitry types, e.g. with predistorter, which mainly involve the field of application of the present invention. As is known, a predistorter comprises non-linear elements which predistort the amplitude and phase of a radio frequency signal with low power level depending on the power level of said signal and the magnitude of the distortions which the amplifier would introduce on the original signal. More specifically, the predistortion trends are pre-set in such a manner that they are equal and opposite to the distortion trends otherwise introduced on the amplifier signal.

A predistortion linearizer has the advantage of speedy operation, and is hence especially well suited upstream of the microwave signal amplifiers. On the other hand, in an amplifier linearized in this manner, there are still possible small gain and phase characteristic variations, due to changes in operating conditions. This is because the gain and phase predistortion trends are initially pre-set in the design phase and are not changed during amplifier operation, except for sporadic manual adjustments when the amplified signal is too degraded. Since said trends accurately reproduce the distortion trends evaluated for a specific amplifier work point, when the work point moves slightly because of the aforementioned thermal drift or ageing phenomena, the distortion trends change accordingly and hence no longer correspond exactly to the predistortion trend. On the other hand the predistorter does not have a feedback configuration, i.e. capable of making the appropriate corrections automatically. Of course this drawback is more sensitively apparent during input signal power peaks.

A second shortcoming of amplifiers linearized by predistorters arises from the fact that the gain of an amplifier has never perfect flat band, and therefore any selection of a new transmission channel, made in the amplifier pass band, necessarily involves a resetting of the gain thereof to adjust the new gain to the previous predistortion curve.

To remedy the above shortcomings there are known linearization procedures and circuits based on the fact that it is possible to acquire knowledge of when the amplifier begins to distort merely by observing the levels of the intermodulation products of a higher order at the amplifier output, since in this case they increase. Said known linearizers therefore include an appropriate feedback system comprising circuits for measurement of the power of the intermodulation products, and circuits using said measurement to generate a signal for correction of the predistortion characteristic in order to recover perfect amplifier linearity.

The main drawback of said linearizers is that there must be made a very accurate measurement of very low power levels such as that of the intermodulation products. In addition, said measurement must be made within well delimited frequency bands. It is clear that the feedback system must therefore include unavoidably costly and sophisticated means which increase the amplifier cost.

In a few cases, as in the European patent application EP-A-0435578, said linearization procedures and circuits are subjected to a simplification mainly consisting in measuring the average power of the input, or output, signal and in using the average value for correction of the predistortion characteristic, in order to recover perfect amplifier linearity. The main drawback of said simplified linearizers is that no precise information about distorsion is obtained out, so that the amount of linearization is insufficient; an acceptable grade of linearization should be carried out only by means of an increasing of the circuitry complexity.

SUMMARY OF THE INVENTION

Accordingly the purpose of the present invention is to overcome the above mentioned shortcomings and indicate a procedure for adaptive compensation of the gain distortions of a microwave amplifier with linearizer, said distortions being caused principally by phenomena which move the amplifier work point, such as for example thermal drift or ageing of the components or other. The procedure is applicable in the case of modulated signals in which the peak to average signal power ratio is constant as for example for digitally modulated signals.

The procedure is based on the fact that said ratio remains constant even after amplification, only if the linearizer/amplifier chain behaves linearly, overall gain compression bringing a decrease in said ratio measured at the amplifier output, compared with the original value of said ratio at the input of the chain, whereas an expansion brings an increase. Therefore, the procedure consists mainly of measuring the peak to average amplified signal power ratio, and using the measurement to change the distortion characteristic AM/AM of the linearizer/amplifier chain to keep said ratio at the output equal to that at input.

To achieve these purposes the object of the present invention is a procedure for adaptive compensation of the gain distortions of an amplifier with linearizer operating on digitally modulated input signals or in any other manner such that the peak to average ratio of modulated signal power is constant, characterised in that the following steps are accomplished in sequence and with continuity:

detection and measurement of the peak power value of the modulation envelope of the signal at the output of the amplifier;

detection and measurement of the average value of the modulation envelope of the signal at the output of the amplifier;

division of the peak power value measured by the measured average power value, obtaining a power ratio evaluated at output;

calculation of the difference between the power ratio evaluated at output and the constant peak to average power ratio of the input signal, the difference constituting an error signal, and calculation, on the basis of the error signal, of corrections to be made to one or more parameters of the linearizer, on which the gain depends, such as to zeroing or minimizing the error signal.

Another object of the present invention is a circuit for adaptive compensation of the gain distortions of an amplifier with linearizer operating on digitally modulated input signals or in any other manner such that the peak to average radio of modulated signal power is constant, characterised in that it comprises:

a peak detector connected to the output of the amplifier at whose output there is a first voltage which measures the peak value of the output signal modulation envelope of the amplifier;

an average value detector connected to the output of the amplifier at whose output is a second voltage which measures the average value of the output signal modulation envelope of the amplifier;

a voltage divider connected to the output of the peak detector, from which can be taken a third voltage equal to Zhe ratio of the first voltage to a constant which depends on the particular type of modulation of the input signal;

a subtraction circuit which executes the difference between the second voltage and third voltage to find an error signal which acts in negative feedback on parameters of the linearizer on which the gain depends.

In accordance with another feature of the invention, between the output of the amplifier and the inputs of the peak detector and average value detector an envelope detector is placed detecting the modulation envelope.

In accordance with a further feature of the invention, the subtraction circuit is an open-loop amplifier to whose inputs arrive the second and third voltages (Vm,Vpk/k) respectively and at whose output is present the error signal.

In accordance with a concomitant feature of the invention, it comprises a circuit which converts the error signal taken with an appropriate sign into a voltage or into a polarisation current for an active element constituting principally the linearizer of the predistortion type.

A linearized amplifier including the compensation circuit of the present invention has excellent linearity in a broad range of temperatures and is not affected by ageing.

Another advantage is that no gain setting is required to prepare the amplifier to operate on a channel chosen inside the operation band.

All the above advantages are secured by using low cost readily available means.

Additional purposes and advantages of the present invention are clarified by the detailed description given below of an embodiment thereof and the annexed drawings given by way of nonlimiting example and in which:

DESCRIPTION OF THE PREFERRED EMBODIMENT

Figure 1:
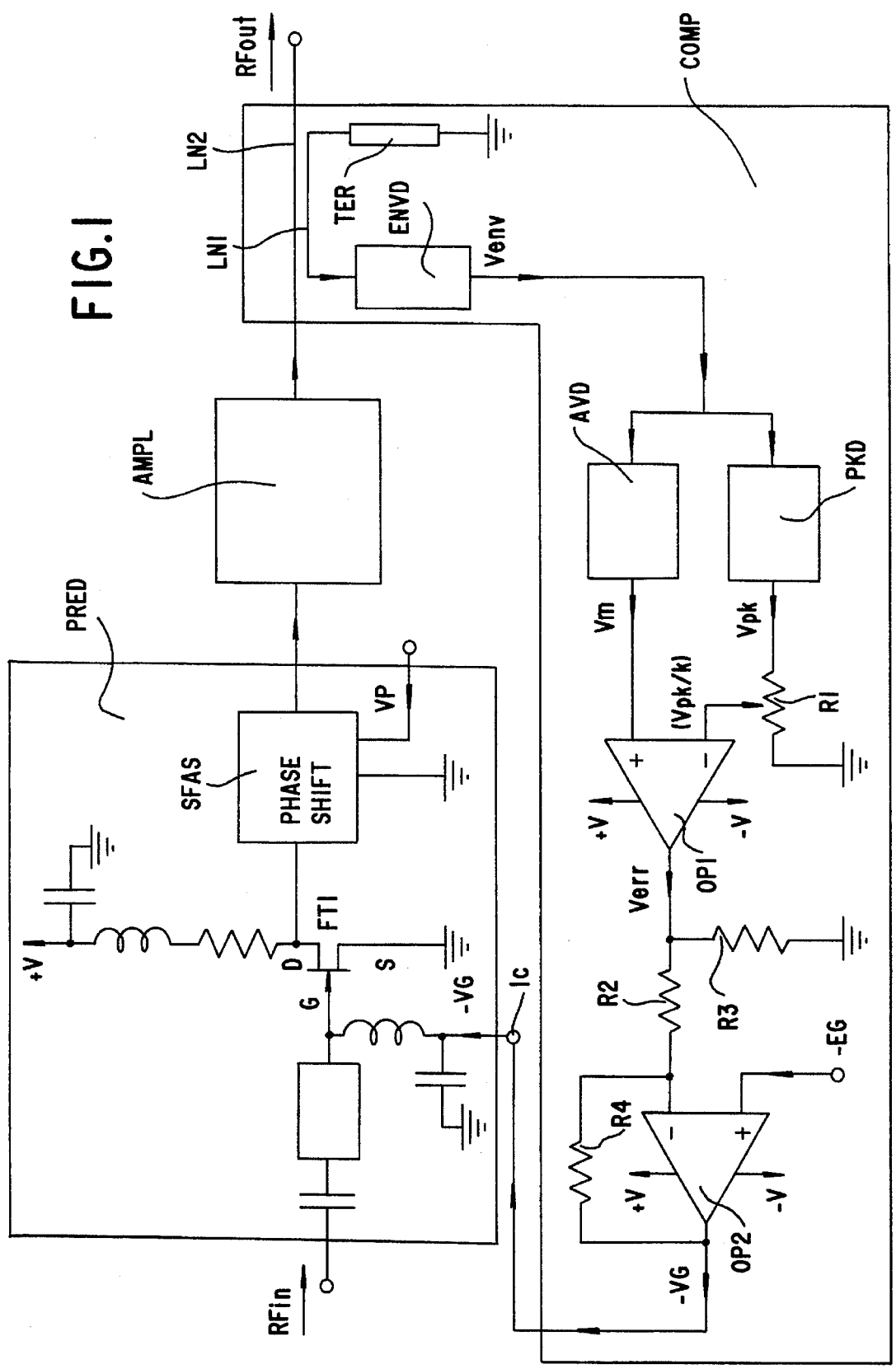
FIG. 1 shows a circuit diagram partially in blocks of an amplifier with linearizer, connected to a circuit for adaptive compensation of the gain distortions which is an object of the present invention.

With reference to FIG. 1, AMPL indicates a microwave power amplifier connected downstream of a predistorter circuit PRED to which arrives a microwave signal RFin. A circuit COMP for adaptive compensation of the gain distortions of the linearized amplifier AMP is connected in feedback between the output of AMPL and a control input Ic of the predistorter PRED.

The microwave signal RFin is 128-TCM digitally modulated. As an alternative, RFin can be a modulated microwave signal in accordance with any QAM digital modulation. More generally, the signal RFin can be any modulated signal in which the peak to average signal power ratio is constant.

The predistorter PRED of the nonlimiting example is that described in Italian patent no. 19975 A/90 filed 9 Apr. 1990 in the name of the same applicant, or in the corresponding European patent application EP-A-0451909. It comprises a FET FT1 to whose gate electrode arrives the signal RFin appropriately subpolarised by a gate-source voltage VG to obtain an expansion of the gain of FT1 for high power values of the signal RFin. The voltage VG is a negative voltage of approximately 1.5 V and thus slightly higher than the pinch-off voltage of FT1. The polarisation voltage VG is applied at a control input Ic of the predistorter and can be adjusted from the outside to better graduate the amplitude of the gain expansion interval.

The drain-source output voltage Vds of FT1 controls a phase shifter SFAS which introduces a phase predistortion on the signal output from FT1. The size of the phase predistortion is adjustable by means of a voltage VP supplied from the outside. The wholly predistorted signal output from the predistorter PRED reaches the input of the amplifier AMPL, whose output signal RFout under rated operating conditions is free from distortions within an extended range of power values of the signal RFin.

The amplifier AMPL of the example consists of a microwave power FET widely available but it is also possible to use microwave tubes with similar distortion characteristics.

The circuit COMP comprises an enveloped detector ENVD provided in known form for microwave operation connected to one end of a line section LN1 whose second end is connected to a grounded termination TER. The line section LN1 is in turn coupled to a transmission line LN2 on which transits the output signal RFout of the amplifier AMPL.

At the output of the detector ENVD there is a signal Venv which reproduces the modulation envelope present on the signal RFout. The signal Venv reaches the inputs of a peak-value sensor PKD and an average-value sensor AVD respectively, both of known type. At the output of the sensor PKD is present a voltage Vpk whose trend in time coincides with that of the peak value of the signal Venv. Similarly, at the output of the sensor AVD is present a voltage Vm whose trend in time coincides with that of the average value of the signal Venv.

The output of the peak detector PKD is connected to a potentiometer R1 from which can be taken an adjustable fraction Vpk/k of the voltage Vpk, k being a partition voltage taken experimentally and tied to the type of modulation of the signal RFin. The voltages Vm and Vpk/k reach the noninverting and inverting inputs respectively of an operational amplifier OP1 with dual power supply +V and −V. The output of the operational OP1 is connected to the centre of a fixed voltage divider consisting of the series of two resistances R2 and R3. The resistance R3 has a second end to ground. The resistance R2 has a second end connected to the inverting input of a second operational OP2 with dual power supply +V and −V, whose noninverting input is connected to a negative voltage reference −EG. Between the inverting input and the output of OP2 is connected a resistance R4. The output OP2 is connected to the control input Ic of the predistorter PRED.

Figure 2:
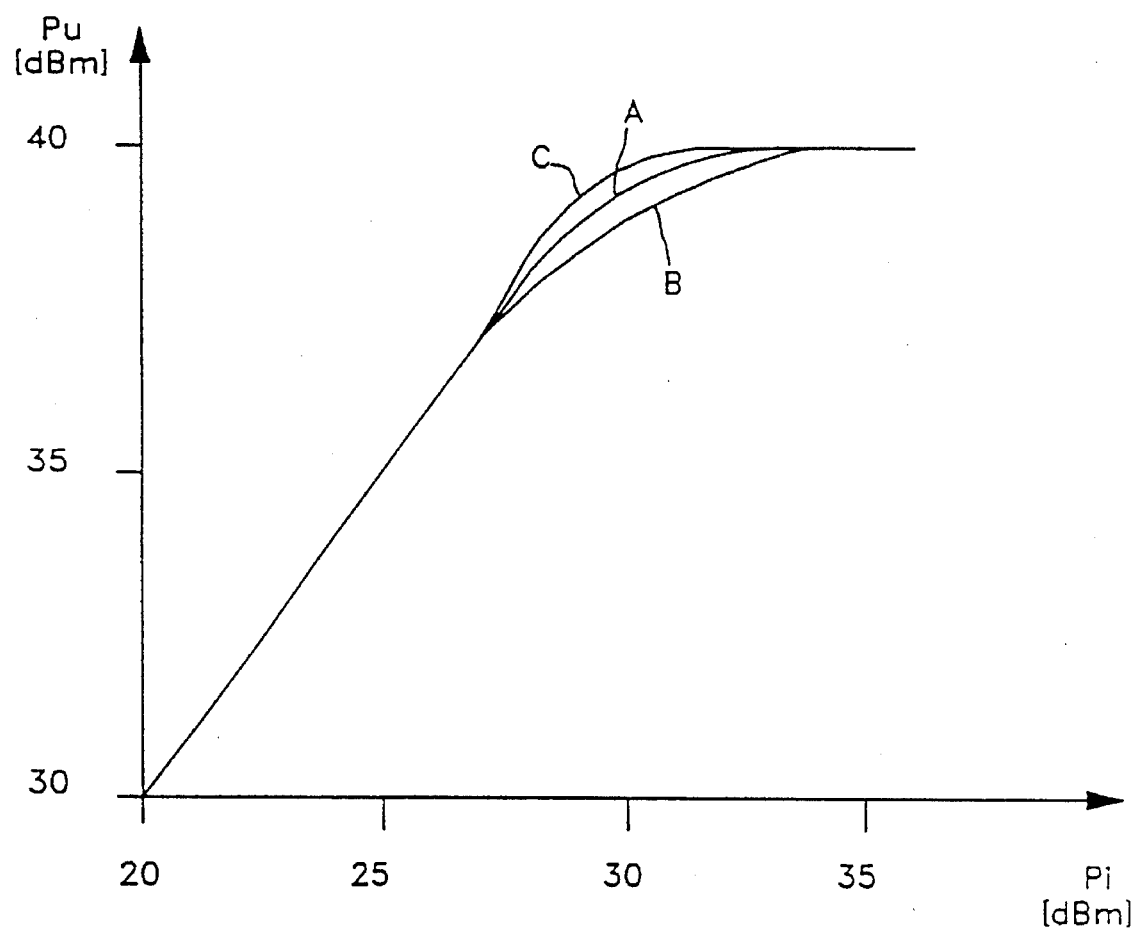
FIG. 2 shows a chart giving some output signal power trends of the amplifier of FIG. 1 when said compensation circuit is not working.

With reference to FIG. 2 there is seen a chart in which are shown three curves A, B and C which represent the trends of the power of the signal RFout (FIG. 1) dependant on that of the signal Rfin, referred to the cascade only of the blocks PRED and AMPL of FIG. 1 and excluding therefore the compensation circuit COMP. Curve A is obtained under rated operating conditions. Curves B and C are obtained when the above conditions do not occur. The curves of FIG. 2 indicate clearly how the gain of the cascade of blocks PRED and AMPL of FIG. 1 changes. More specifically, in the linear section of the three curves, the gain is constant and the amplifier AMPL is perfectly linearized in any operating condition. In the knee area of curve A, the gain undergoes an unavoidable and no longer linearizable compression, due to the saturation thereof. In the knee area of curve B the gain shows further compression compared with that of a curve A. The opposite case occurs in the knee area of curve C where the gain shows expansion compared with that of curve A.

As already mentioned, for a digitally modulated signal RFin, the peak to average signal power ratio is constant and remains constant after amplification only if the predistorter/amplifier system behaves linearly. If, mainly because of thermal drift or ageing phenomena, the work point of AMPL moves, the peak to average power ratio measured at the output of the amplifier AMPL undergoes proportionate changes. For example, on curve B it decreases and on curve C it increases.

A circuitry implementation of the procedure in question strictly as set forth would be costly mainly because of the fact that the phases of the procedure are for power rather than voltage values. The circuit would require the use of logarithmic amplifiers to obtain the logarithms of average and peak power measured at the output, after which the ratio of said powers would be converted into a difference between the respective logarithms. Subsequently an antilogarithmic amplifier would obtain a value to be compared with the constant ratio of said input powers, generating an error signal to be used in feedback on the linearizer and taking the trends of curves B and C of FIG. 2 back to that of curve A.

In practice it was preferred to implement a simpler circuit such as that of FIG. 1 which while not applying strictly the above procedure is however capable of compensating very well for the loss of amplifier linearity. The simplification was that of having expressed the error in a manner strictly applicable only in case of null error, also using the voltages Vpk and Vm in place of the respective powers. The validity of this proceeding depends on the fact that the circuit acts by restricting the error Verr to a very small value.

Operationally the first thing to do is to exclude the circuit COMP and choose a constant value −VG' of the voltage −VG, such that under rated operating conditions the amplifier AMPL is completely linearized even on the peaks of the signal RFin. I.e. −VG' is the voltage which would be applied directly to the input Ic if the circuit COMP were not there. In this case the gain of AMPL is indicated by curve A of FIG. 2. It is then necessary to insert the compensation circuit COMP by setting −EG =VG' and adjusting the voltage division value k of the potentiometer R1 so as to cancel out the voltage between the two inputs of OP1. In this case the voltage Verr at the output of OP1 is also null and remains so as long as rated operating conditions continue. Operating as above we obtain: k=Vpk/Vm, experimentally determined by measurement of Vpk and Vm and their ratio.

The operational OP2 is a voltage adder. Its output voltage −VG is equal to the sum of the voltage −EG and the voltage Verr inverted and appropriately weighed. It can therefore be verified that under rated conditions, so that Verr=O, −VG= −EG=−VG' is true and the circuit COMP does not intervene. Any cause which takes the system outside the rated operating conditions will make Vm≠Vpk/k, i.e. the voltage between the inputs of OP1 will be other than zero. Consequently at the output of OP1 there will be a voltage error Verr≠0. The polarities of the voltages Vm, Vpk, −EG, together with the inverting/noninverting polarities of the inputs of OP1 and OP2 to which they arrive, are such that the system is negatively fedback. An example may be more explanatory: if we assume that power at the output tends to move onto curve B of FIG. 2, at the inputs of OP1 Vm >Vpk/k. Prevailing of the voltage Vm on the noninverting input of OP1 in relation to the voltage on the inverting input brings a positive voltage Verr at the output of OP1. The operational OP2 subtracts Verr from the voltage −EG, increasing the negative value of −VG. Consequently the polarisation of the FET FT1, moves more toward the pinch-off zone, causing greater gain expansion of the FET FT1 which compensates for the further gain compression of the amplifier AMPL on curve B of FIG. 2, which is thus taken back to work on curve A. With analogous considerations it is easy to verify the opposite case also.

It should be clarified that the gain of OP1 coincides approximately with open loop gain, theoretically infinite, and therefore the circuit COMP is particularly efficient in compensating for gain distortions of the amplifier AMPL.

In the circuit COMP of FIG. 1 there are not provided special means for acting on the phase of the signal RFin to compensate for any distortions introduced on the phase of the signal RFout for the same causes which distort the gain of AMPL. It should however be clarified that in QAM systems amplitude distortions are much more critical than those of phase. Furthermore, in the attempt to compensate for the gain distortions, the compensation circuit COMP also accomplishes indirectly a partial compensation of the phase distortions.

The compensation circuit COMP is capable of operating with any amplifier/linearizer of known type, not necessarily microwave, since it generates a control magnitude which acts on the linearization parameters on which depends the behaviour of overall gain. For example, in the case of diode linearization, the voltage −VG at the output of COMP can be converted into polarisation current of the diodes.

We claim:

1. A method for adaptive compensation of linearized amplifier gain distortions in digitally modulated signals amplification, or in amplification of any other modulated signal such that a peak-to-average power ratio is constant, which method comprises the following steps to be performed sequentially and continuously:

detecting and measuring a peak power value and an average power value of modulation envelope of an amplified signal;

subtracting a constant peak-to-average power ratio from the peak to average power ratio of the amplified signal so as to obtain an error signal; and correcting the gain of the linearized amplifier for zeroing or minimizing the error signal.

2. A circuit for adaptively compensating gain distortions of a microwave amplifier with a linearizer, operating on digitally modulated input signals or in any other manner such that a peak-to-average ratio of modulated signal power is constant, and wherein the amplifier has an output issuing an output signal with a modulation envelope and the linearizer has an input receiving an input signal, the circuit which comprises:

- a peak detector connected to an output of an amplifier, said peak detector having an output carrying a first voltage measuring a peak value of an output signal modulation envelope of the amplifier;
- an average value detector connected to the output of the amplifier, said average value detector having an output carrying a second voltage measuring an average value of the output signal modulation envelope of the amplifier;
- a voltage divider connected to said output of said peak detector, said voltage divider providing a third voltage equal to a ratio of the first voltage to a constant which depends on a ratio of the peak value to an average value of an input signal; and
- a subtraction circuit forming a difference between the second voltage and the third voltage and finding an error signal which acts in negative feedback on parameters of the linearizer on which a gain of the amplifier depends.

3. The circuit according to claim 2, which further comprises an envelope detector connected between the output of the amplifier and the inputs of said peak detector and average value detector, said envelope detector detecting the modulation envelope.

4. The circuit according to claim 2, wherein said subtraction circuit is an open-loop amplifier having inputs and an output, said inputs receiving the second and third voltages, and said output of said open-loop amplifier issuing the error signal.

5. The circuit according to claim 2, which further comprises a circuit for converting the error signal, taken with an appropriate sign, into a voltage for controlling the linearizer.

* * * * *